United States Patent [19]

Shinji

[11] Patent Number: 5,578,842
[45] Date of Patent: Nov. 26, 1996

[54] CHARGE COUPLED DEVICE IMAGE SENSOR

[75] Inventor: Uva Shinji, Kyungki-do, Rep. of Korea

[73] Assignee: LG Semicon Co., Ltd., Seoul, Rep. of Korea

[21] Appl. No.: 405,375

[22] Filed: Mar. 15, 1995

Related U.S. Application Data

[63] Continuation of Ser. No. 113,598, Aug. 27, 1993, abandoned.

[51] Int. Cl.$^6$ .............................. H01L 29/78; H01L 27/14
[52] U.S. Cl. ...................... 257/223; 257/233; 257/243; 257/432
[58] Field of Search ..................................... 257/223, 233, 257/224, 229, 230, 243, 432

[56] References Cited

U.S. PATENT DOCUMENTS

| | | | |
|---|---|---|---|
| 4,814,848 | 3/1989 | Akimoto et al. | 257/223 |
| 4,963,983 | 10/1990 | Kohno et al. | 257/223 |

FOREIGN PATENT DOCUMENTS

| | | | |
|---|---|---|---|
| 91/03839 | 3/1991 | WIPO | 257/223 |

Primary Examiner—Donald L. Monin, Jr.
Attorney, Agent, or Firm—Morgan, Lewis and Bockius LLP

[57] ABSTRACT

A charge coupled device (CCD) image sensor and more particularly a wiring of charge transfer electrodes of a CCD image sensor which is made suitable for improving the charge transfer efficiency of vertical charge coupled devices (VCCDs) thereof. The CCD image sensor includes: a plurality of photoelectric conversion regions for converting light incident to a semiconductor substrate into image signal charges; a plurality of VCCD regions for transmitting image signal charges generated in the plurality of photoelectric conversion regions in a vertical direction; a plurality of transfer gate electrodes for transmitting the image signal charges generated in the plurality of photoelectric conversion regions in four phases in the vertical direction; an insulation film for insulating the plurality of transfer gate electrodes; first metal layers formed over the plurality of photoelectric conversion regions and the plurality of VCCD regions for intercepting light; and a second metal layer formed over the plurality of VCCD regions for connecting between transfer gate electrodes the same clock signals applied thereto within one VCCD and shielding light incident to the VCCD region.

11 Claims, 8 Drawing Sheets

CHARGE COUPLED DEVICE IMAGE SENSOR

This is a continuation of application Ser. No. 08/133,598 filed on Aug. 27, 1993; now abandoned.

BACKGROUND OF THE INVENTION

1. Field of the Invention

The present invention relates in general to a solid state image sensor, and more particularly to a solid state image sensor having a vertical overflow drain structure and using a plurality of photo diodes for photoelectric conversion, and using a plurality of charge coupled devices (hereinbelow, referred to simply as "the CCD") for signal charge transmission, and suitable for used in the case of requiring lower smear and lower blooming.

2. Description of the Prior Art

A description of a problem introduced by a conventional solid state image sensor will be given as referring to an interline type CCD solid state image sensor formed on a N-type silicon wafer, for an example.

Figure 8:
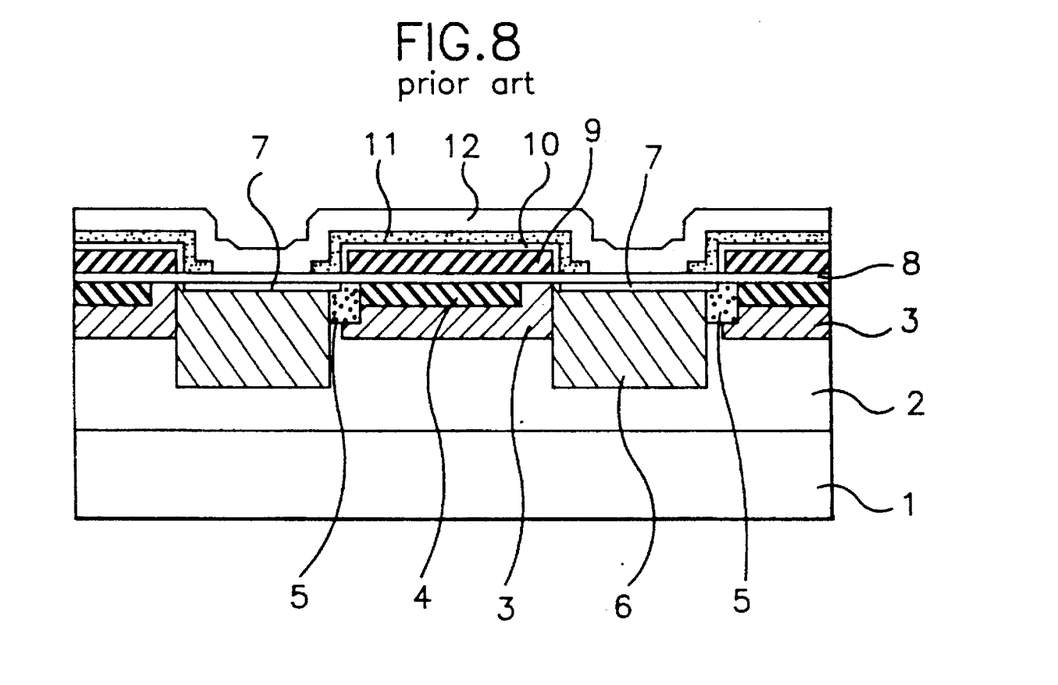
FIG. 8 is a sectional view of a pixel of a solid state image sensor in accordance with the prior art.

With reference to FIG. 8, there is shown in a cross sectional view a structure of a pixel formed on a silicon substrate of a two-dimensional solid state image sensor. The pixel structure includes a first well layer 2 of a predetermined thickness deposited on a surface of a N-type silicon substrate 1 to cover all of the pixel region. The pixel structure further includes a second well layer 3 which has a thickness substantially less than that of the first well layer 2 and covers a CCD channel region 4.

The incident light reaching the surface of the CCD through a given optical system is received by a photo diode 6 through an opening of a light blanket layer 11. Here, the second well layer 3 serves to block the electrons generated by the incident light inside the first well layer 2 and to restrict the smear caused by leakage of the electrons into the CCD channel 4.

The N-type silicon substrate 1 is biased by a positive electric potential so that when there is generated in the photo diode an excessive charge, exceeding the capacity of the photo diode 6, the electrons are emitted from the photo diode 6 to the silicon substrate 1.

A problem of the aforementioned solid state image sensor is resided in that only the smallest part of the incident light received by the surface of the CCD can be photoelectrically converted.

One approach to enlargement of the part of the incident light to be photoelectrically converted is to use a lens provided on a surface of the CCD corresponding to each of the pixels to focus the incident light on a corresponding photo diode 6.

Figure 9:
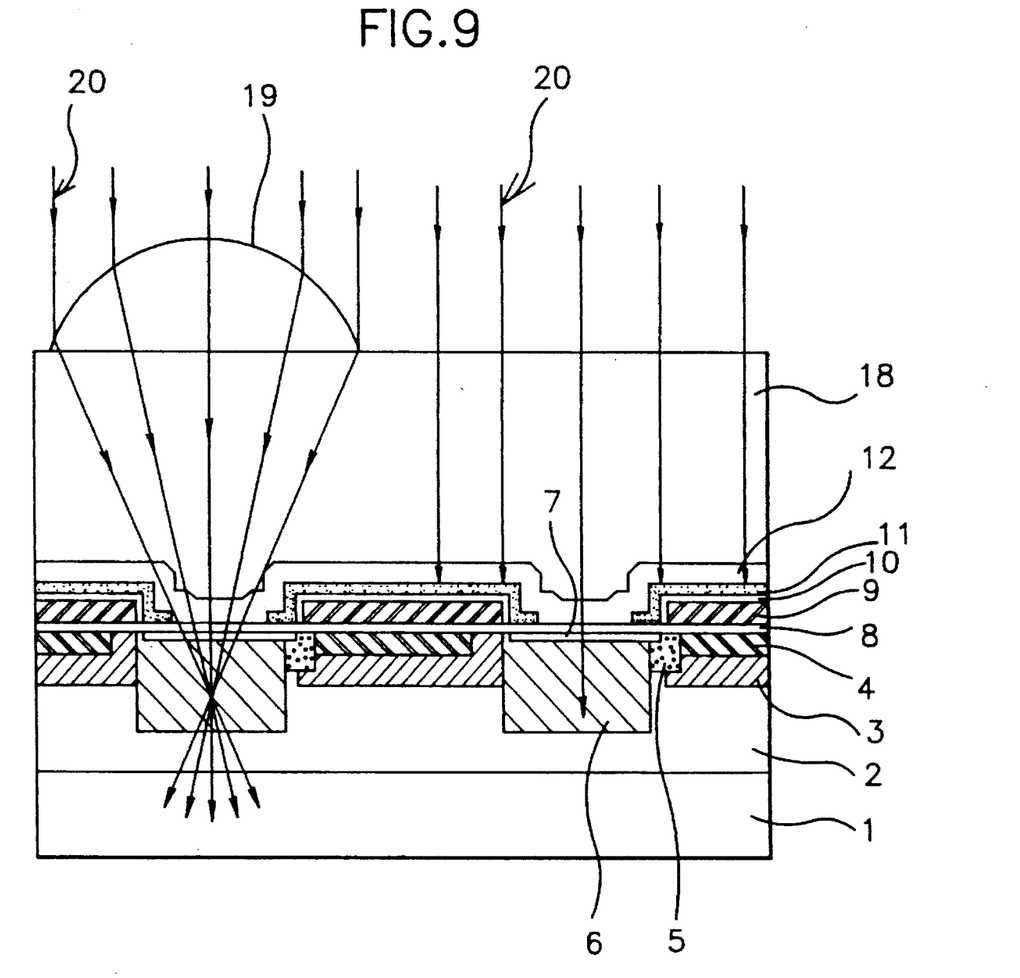
FIG. 9 is a sectional view of the pixel of the solid state image sensor for comparatively showing a light focusing effect of a lens provided on the CCD surface.

FIG. 9 shows a sectional view of pixels of the solid state image sensor to comparatively show a light focusing effect of a lens provided on the CCD surface. In this drawing, the left-side pixel is provided with a micro lens 19, however, the right-side pixel has no lens.

As represented by the light paths 20 of the incident lights of FIG. 9, the light are focused on the photo diode 6 by the micro lens 19. In this regard, it is noted that the using efficiency of the incident light is remarkably improved by the micro lens 19. It is known to those skilled in the art that the use of the lens 19 achieves an improvement of the sensitivity of two or three times as much as the case of no use of the lens.

However, the use of the micro lens 19 also causes a problem that it increases the smear due to the following reason.

Conventionally, all of the incident light beams can not be vertically received by the surface of the CCD, but only a light beam passing through the center of the optical system is vertically received by the surface of the CCD since there is an angular distribution in the incident angle of the light depending upon the types of optical systems.

That is, when enlarging the iris used for adjusting the quantity of light, the incident angle distribution is also enlarged. However, when making this iris narrow, the incident angle distribution is also narrowed.

In addition, the incident angle distribution also shows a difference between the center of and the periphery of the light receiving section of the CCD. Otherwise stated, the incident light at the periphery of the light receiving section of the CCD is received by the CCD surface at an incident angle diverging at the maximum from the perpendicular of the CCD.

Figure 10:
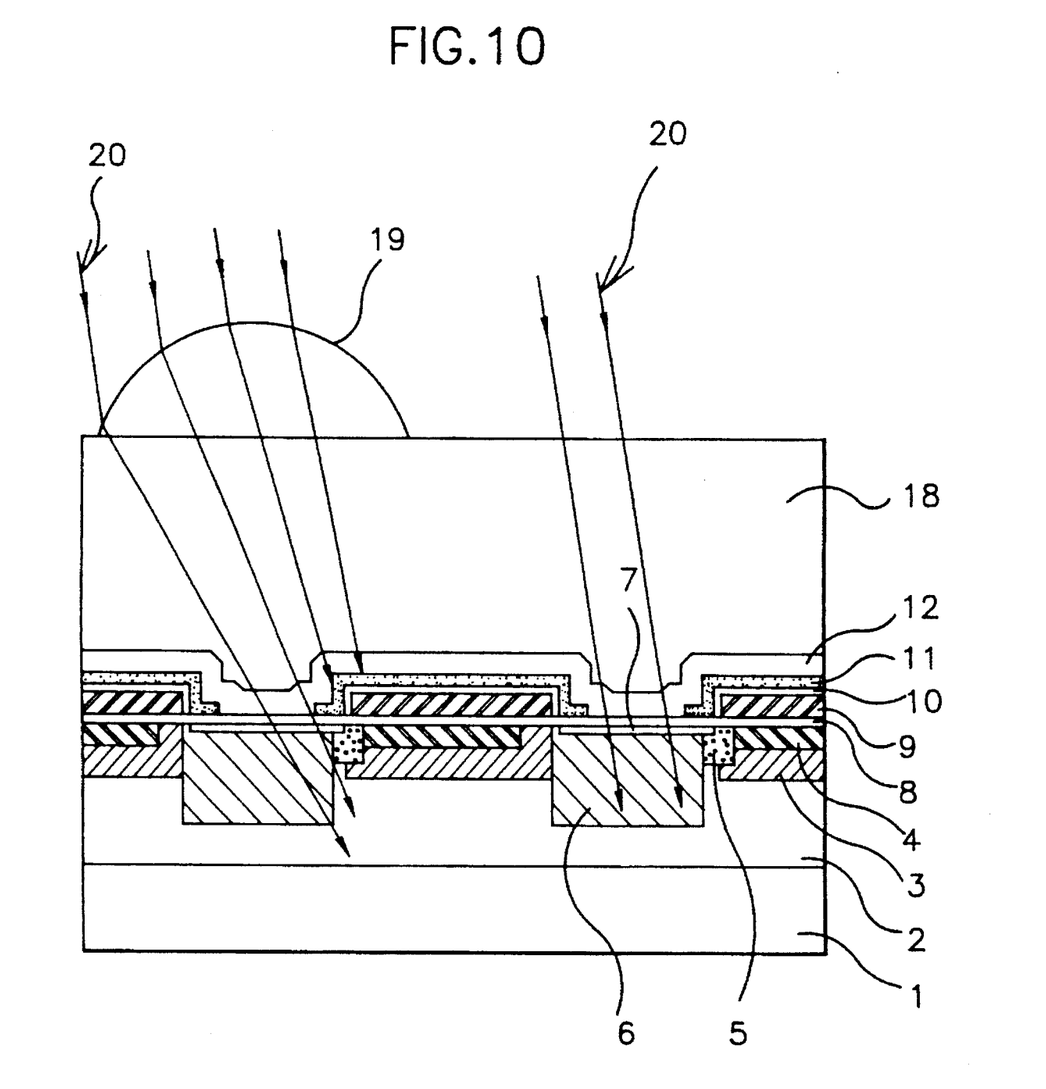
FIG. 10 is a sectional view of the pixel of the solid state image sensor for showing incident light paths when the light beams are received by the CCD along the light paths diverging from the perpendicular of the CCD.

FIG. 10 shows incident light paths when the light beams are received by the CCD through light paths diverging from the perpendicular of the CCD.

As shown in this drawing, there is no change in the incident angle of the light beam when there is no lens provided on the CCD, however, when the lens 19 is provided on the CCD, the light beam is refracted by the lens 19 to increase the divergence of the incident light paths from the perpendicular of the CCD, thereby causing the light paths to get .near the CCD channel 4.

Since the second well layer 3 serves as a barrier for the CCD channel 4, the fact that the light paths get near the CCD channel 4 causes no smear. However, when an intensive light of which the quantity of light is 1,000 times as much as the saturated quantity of light is received by the CCD through the same light paths described above, there is a variation of the electric potential due to the electric charge generated by the intensive incident light and this causes a great number of electrons to be rushed into the CCD channel 4.

The ratio of the light component reflected by the surface of the silicon substrate 1 is increased in proportion to the divergence of the incident light from the perpendicular of the CCD, so that the light component repeatedly reflected by both the silicon surface and the light blanket layer 11 prior to its incidence to the photo diode 6 is increased.

It is possible to prevent the smear, caused by the divergence of the incident light from the perpendicular of the CCD, by making narrow the gap between the silicon surface and the light blanket layer 11.

However, the known technology can not prevent the smear, caused by the electrons rushed into the CCD channel 4 when the intensive light of which the quantity of light is 1,000 times as much as the saturated quantity of light is received by the CCD.

If briefly described, the known CCD solid state image sensor has a serious problem that the smear according to variation of the incident angle distribution is such remarkable that it can not be prevented by the use of lens provided on the surface of the CCD.

SUMMARY OF THE INVENTION

It is, therefore, an object of the present invention to provide a CCD solid state image sensor in which the aforementioned problem can be overcome and which efficiently prevents the smear.

In order to achieve the above object, the present invention uses an intrinsic well structure as described hereinbelow.

The deep well covering the photo diode has a stripe shape and a well structure horizontally separated.

The shallow well covering the CCD channel region is used as a separating zone for separating the CCD channel from the silicon substrate.

In addition, the well provided under the CCD channel region is constructed such that its depth is less than that of the well under the photo diode region and a buried well having the same conductivity as that of the silicon substrate is formed under the CCD channel region.

At this time, it is possible to make shallow the depth of the well under the separating zone between the photo diodes, and an additional buried well having the same conductivity as that of the silicon substrate may be formed under the separating zone between the photo diodes.

Here, the deep well covering the photo diode defines an island corresponding to the photo diode of the pixel to provide a separated well structure for every pixel.

In accordance with the present invention, a buried layer of a higher concentration, instead of the shallow well covering the CCD channel region, may be formed under the CCD channel region.

When the aforementioned structure is adapted to the CCD solid state image sensor, the region under the CCD channel constitutes the substrate with the shallow well interposed between the CCD channel and the substrate.

As well known to those skilled in the art, the substrate is applied with a bias potential in order to prevent the blooming and, as a result, when the electric charge enters the substrate region applied with the bias potential, the electric charge is discharged from the substrate.

When the region extends to a position closely under the CCD channel, the electric charge generated by the incident light about the CCD channel region is rapidly discharged to the substrate.

The solid state image sensor of the present invention also restricts the variation of the potential distribution caused by the electric charge, so that it completely prevents the smear and improves the blooming resistance.

When the deep well covering the photo diode defines the island corresponding to the photo diode of the pixel and the pixel has the separated well structure, the solid state image sensor of this invention achieves a desired separation between the photo diodes as well as prevention of blooming. Furthermore, the deterioration of modulation transfer function (MTF) caused by an intensive light can be prevented.

Meanwhile, when the buried layer of the higher concentration is formed under the CCD channel region, this buried layer serves as a stronger barrier region. Thus, it is possible to restrict the variation of the potential distribution caused by the electric charge even when an intensive light is received by the CCD along a light path inclined with respect to the perpendicular of the CCD art an inclination angle. In this case, the smear resistance against the intensive light is remarkably increased.

BRIEF DESCRIPTION OF THE DRAWINGS

The above and other objects, features and other advantages of the present invention will be more clearly understood from the following detailed description taken in conjunction with the accompanying drawings, in which:

FIGS. 4a to 4c are sectional views of a fourth embodiment of the present invention, in which:

FIGS. 6a to 6c are pattern layout diagrams of well structures in accordance with embodiments of the present invention, in which:

DESCRIPTION OF THE PREFERRED EMBODIMENTS

A description of a solid state image sensor in accordance with the present invention will be given as referring to an interline transistor type CCD formed on a N-type silicon wafer, for an example.

Figure 1:
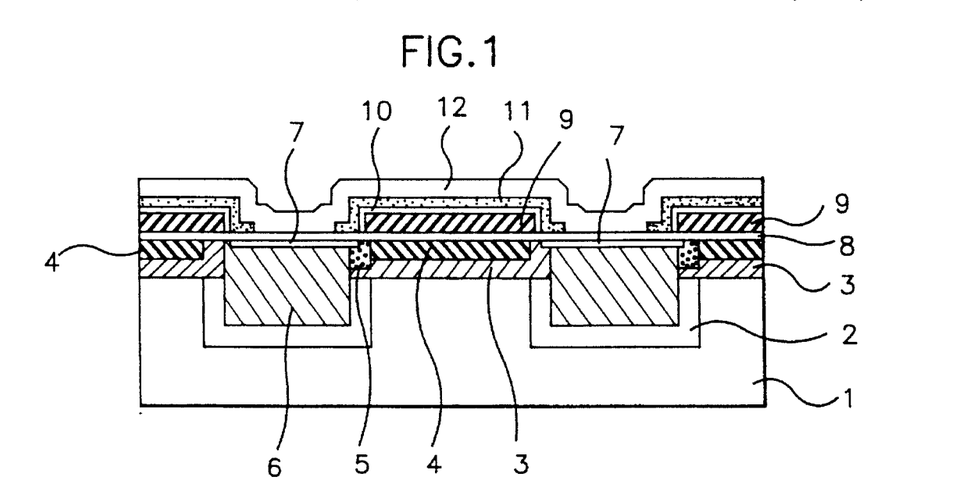
FIG. 1 is a sectional view of a pixel of a solid state image sensor in accordance with a primary embodiment of the present invention.

With reference to FIG. 1, there is shown in a sectional view of a pixel in accordance with a primary embodiment of the present invention.

The pixel of this primary embodiment comprises a first P-type well layer 2 deposited on a surface of a N-type silicon substrate 1 to cover a photo diode 6. The pixel also comprises a second P-type well layer 3 which has a depth remarkably less than that of the first well layer 2 and covers a CCD channel region 4. There is no first well layer 2 under the CCD channel region 4, so that the second well layer 3 serves as a separating zone for separating the CCD channel region 4 from the N-type silicon substrate 1.

Since the N-type silicon substrate 1 is biased by a positive potential in order for emission of excessive charge, the second well layer 3 exhibits a sufficient higher concentration.

Thanking for such a construction of the pixel of this invention as described above, the smear is desirably restricted even when the light is received by the CCD along a light path inclined with respect to the perpendicular of the CCD as shown in FIG. 10. Otherwise stated, when the light is received by the CCD as being inclined with respect to the perpendicular of the CCD, the electric charge is not generated in the well layer differently from the known pixel of the solid state image sensor, but generated in the N-type silicon substrate, so that the smear is efficiently restricted.

In addition, the present invention limits the variation of the potential distribution due to the electric charge generated by the intensive incident light.

Varieties of box-shaped well structures shown in FIG. 1 and an impurity distribution are impossible to be achieved by a conventional ion implantation.

However in recent, it is possible to implant ion with a high energy of about 3 MeV., so that the formation of the well structure of FIG. 1 is easily achieved.

Figure 2:
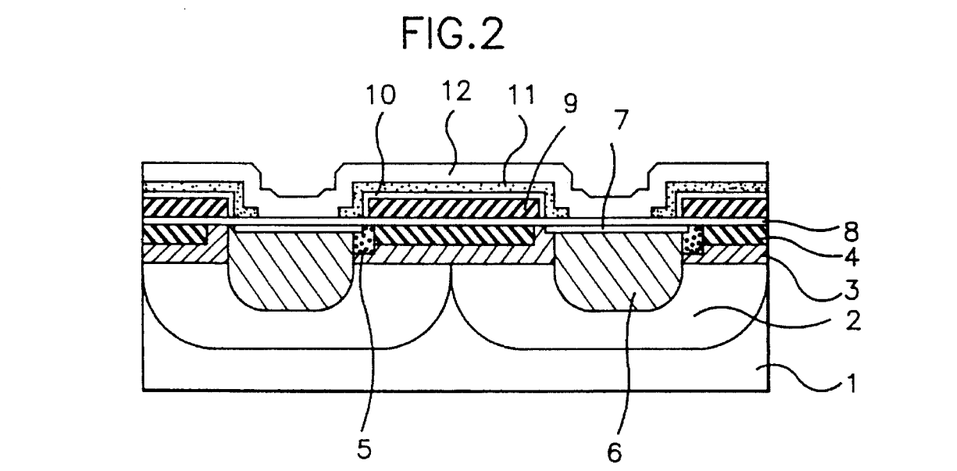
FIG. 2 is a view corresponding to FIG. 1, but showing a second embodiment of the present invention.

FIG. 2 shows in a sectional view a pixel in accordance with a second embodiment of the present invention. In this second embodiment, a well structure similar to that of FIG. 1 is prepared using the conventional well preparation technique.

In order to form the well structure of FIG. 2, an ion implantation is carried out with an accelerated voltage of about 180 KV. at the maximum and thereafter a well drive-in step is carried out by a heat treatment at high temperatures of about 1,200° C. As a result of the ion implantation and the high temperature heat treatment, the lateral diffusion in the first well layer 2 covering the photo diode 6 is intensified to form the well structure shown in FIG. 2.

That is, part of a second well layer 3 overlaps with a first well layer 2 covering a photo diode 6 neighboring this second well layer 3.

When there is a lateral diffusion in the first well layer 2 as in the case of FIG. 2, the same effect as in the primary embodiment of FIG. 1 is achieved since the region of the N-type silicon substrate extends to a region under the CCD channel 4.

Of course, it should be noted that the same effect may be achieved more or less by a well structure which lies halfway between the structures of FIG. 1 and FIG. 2 and by a well structure where the overlapping portion between the neighboring wells 2 and 3 is larger than the structure of FIG. 2.

Figure 3:
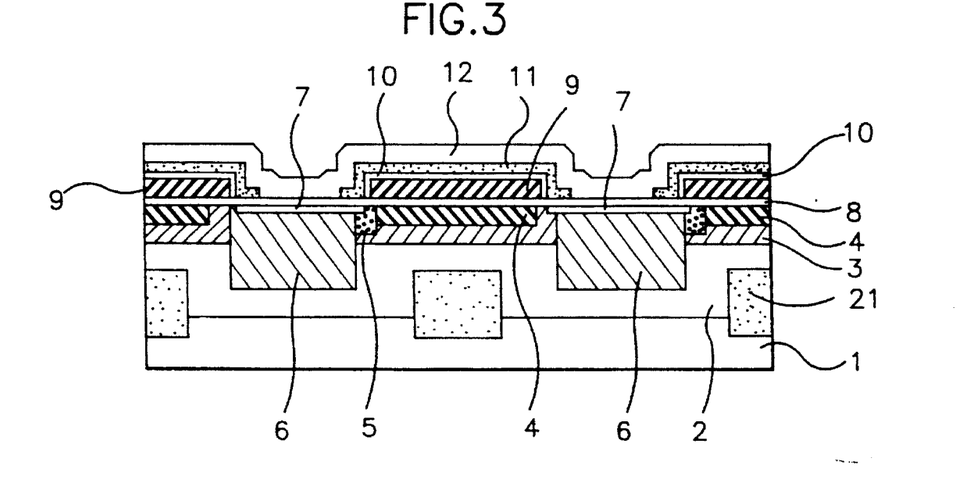
FIG. 3 is a view corresponding to FIG. 1, but showing a third embodiment of the present invention.

Turning to FIG. 3 showing the third embodiment of the present invention, the general shape of the first well layer 2 remains the same as in the conventional structure of FIG. 8, however, in this second embodiment, a buried layer 21 of the same conductivity as that of the silicon substrate 1 is formed under the second well layer 3 covering the CCD channel region 4.

This second embodiment achieves the same effect as described for the primary embodiment of FIG. 1.

The buried layer 21 of the same conductivity as that of the substrate 1 is preferably formed by the aforementioned high energy ion implantation.

Figure 4A:
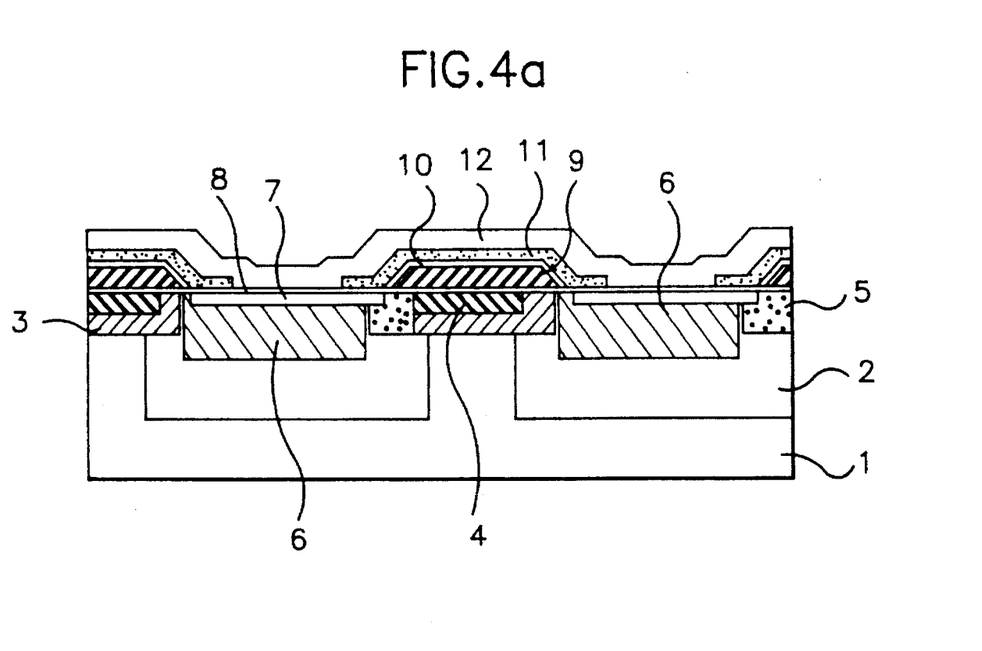
FIG. 4a is a horizontal sectional view of the pixel of the fourth embodiment.
Figure 4B:
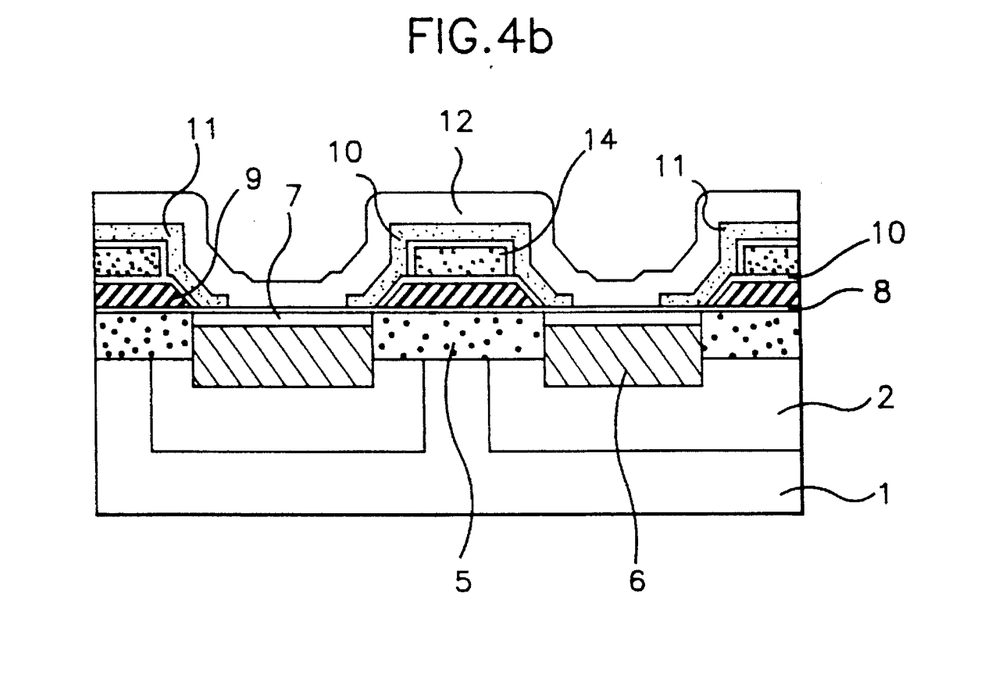
FIG. 4b is a vertical sectional view of the pixel of the fourth embodiment.

FIGS. 4a and 4b show, in a horizontal sectional view alike FIG. 1 and in a vertical sectional view, a pixel according to a fourth embodiment of the present invention, respectively. In this fourth embodiment, the first well layers 2 covering the photo diodes 6 are separated from each other in the horizontal direction as well as in the vertical direction as best seen in FIG. 4. In addition, the first well layers 2 of the pixels define independent islands.

In this fourth embodiment, the influence by both the smear and the blooming is remarkably reduced in accordance with the same theory as in the primary embodiment of FIG. 1. As a result, the deterioration of the MTF due to the intensive incident light is substantially prevented.

Figure 4C:
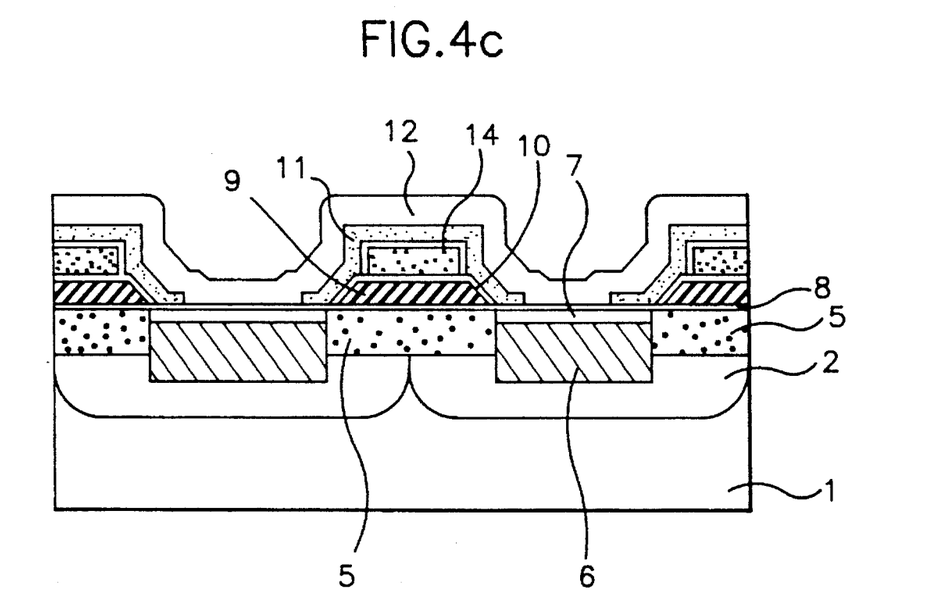
FIG. 4c is a vertical sectional view of a pixel where the fourth embodiment is adapted to the structure of FIG. 2.

Turning to FIG. 4c, there is shown in a vertical sectional view a pixel where the fourth embodiment of the present invention is adapted to the structure of FIG. 2. The horizontal section of the pixel of FIG. 4c is nearly same as that of FIG. 2 and the horizontal sectional view of the pixel is thus not deemed necessary to be shown in the drawing.

The pixel of FIG. 4c results in the same effect as in the structure of FIG. 4b alike the structure of FIG. 2.

Figure 5:
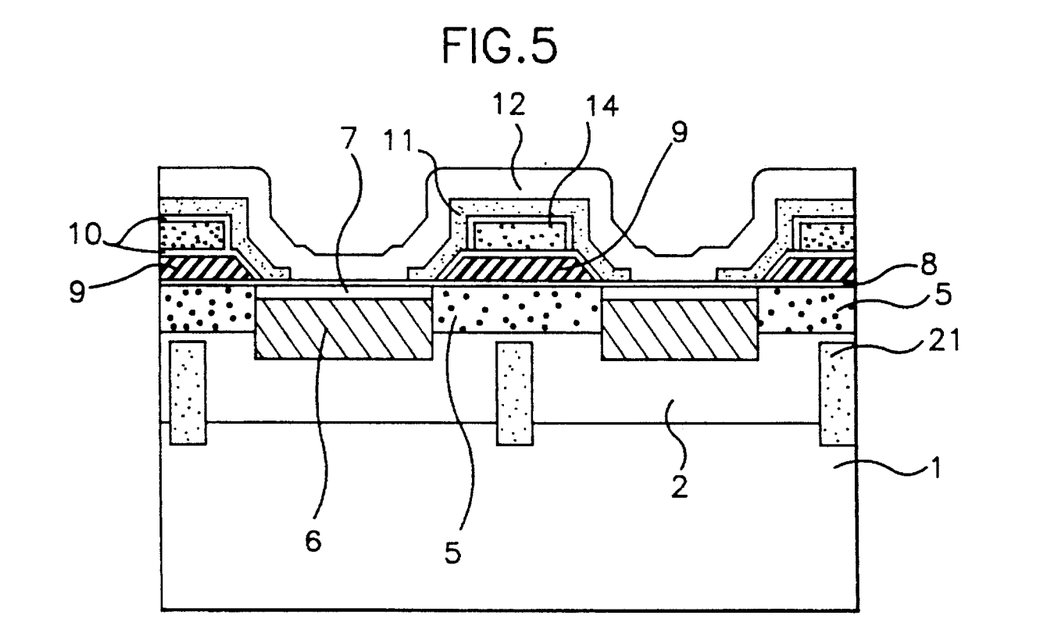
FIG. 5 is a view corresponding to FIG. 4b, but showing a fifth embodiment of the present invention.

FIG. 5 shows a fifth embodiment of the present invention. In this fifth embodiment, the general shape of the first well layer 2 remains the same as in the conventional structure of FIG. 8. However, this fifth embodiment has a buried layer 21 which has the same conductivity as that of the silicon substrate 1 and is formed under a pixel separating region 5 extending between two neighboring photo diodes 6.

This fifth embodiment achieves the effect similar to that of the fourth embodiment of FIG. 4b.

The buried layer 21 of the same conductivity as that of the substrate 1 is preferably formed by the aforementioned high energy ion implantation alike the third embodiment of FIG. 3.

Figure 6A:
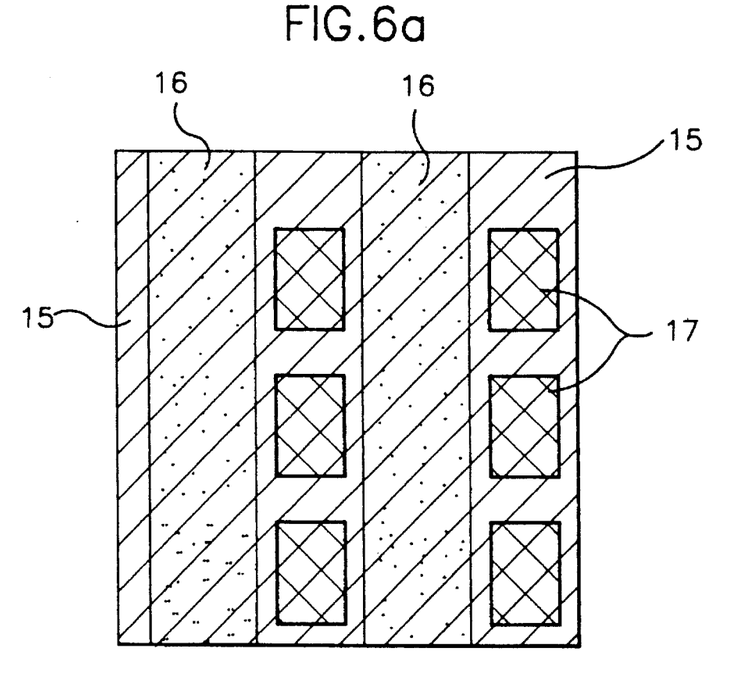
FIG. 6a shows a pattern layout of a known pixel of FIG. 8.
Figure 6B:
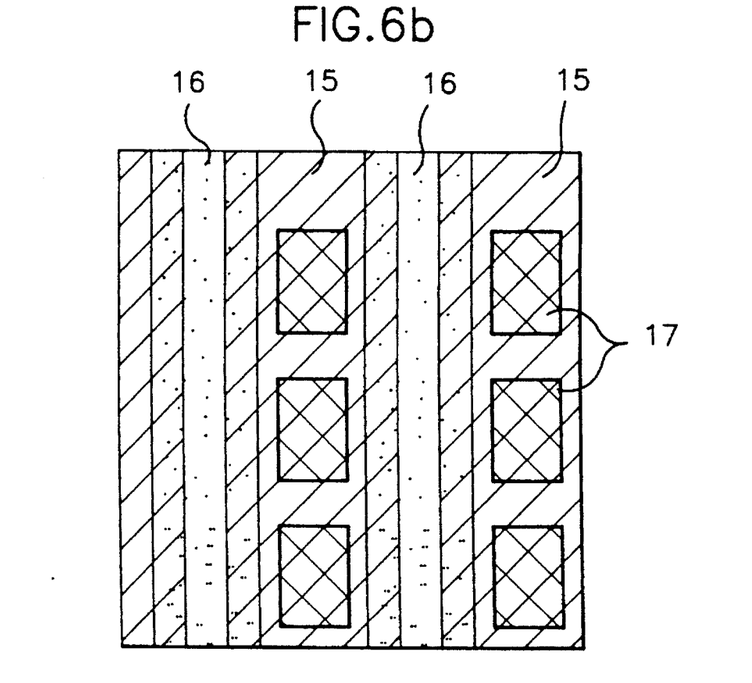
FIG. 6b shows a pattern layout of the primary embodiment of FIG. 1.
Figure 6C:
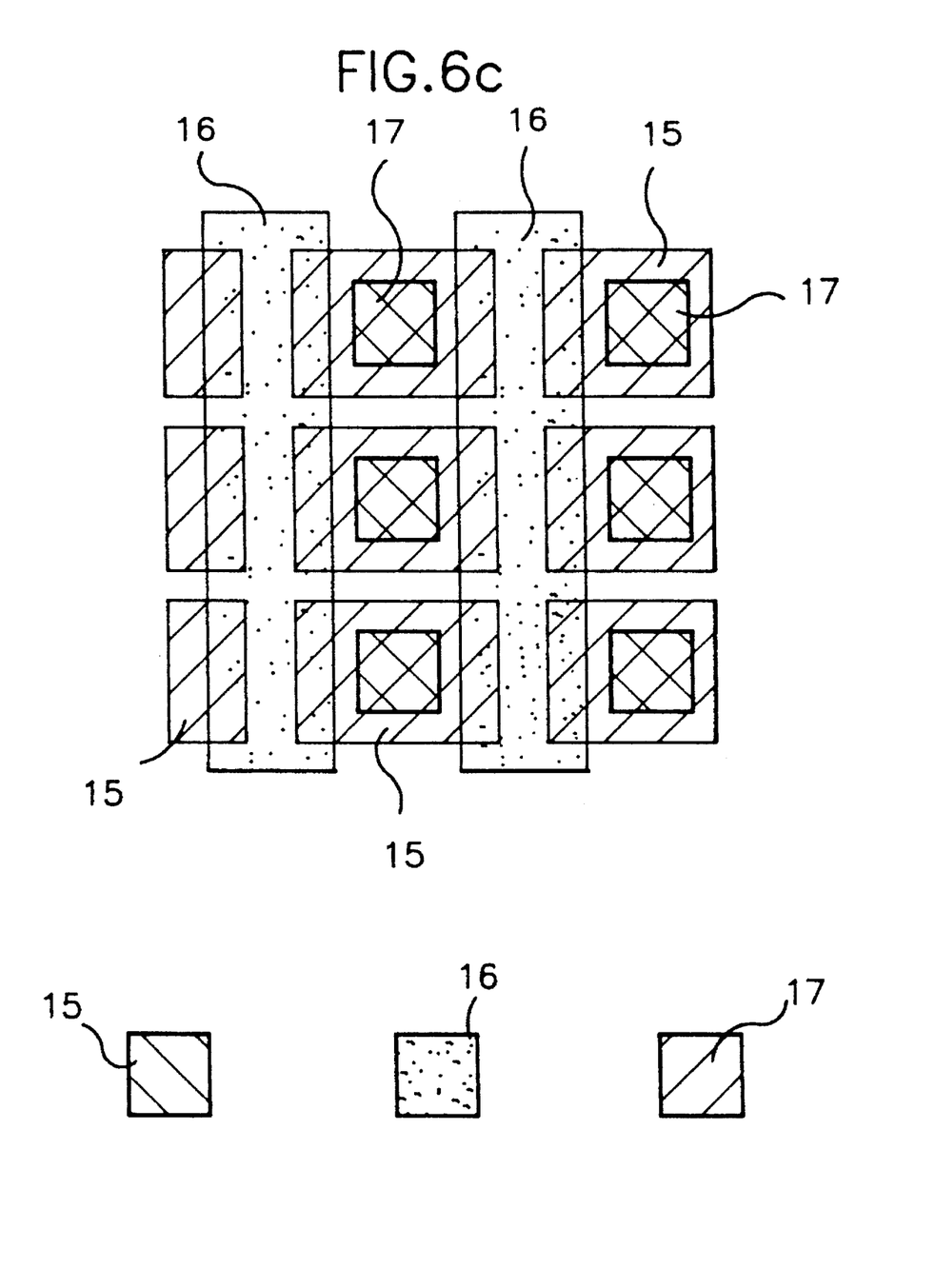
FIG. 6c shows a pattern layout of the fourth embodiment of FIGS. 4a and 4b.

Turning to FIGS. 6a to 6c, there are shown in plan views pattern layouts of first wells 15, CCD channels 16 and photo diodes 17 formed on the surface of the silicon substrate, respectively. FIG. 6a shows the known embodiment of FIG. 8, FIG. 6b shows the primary embodiment of FIG. 1, and FIG. 6c shows the fourth embodiment of FIGS. 4a and 4b.

The first wells 15 of FIG. 6a cover all of the pixel region, however, each of the first wells 15 of FIG. 6b shows a stripe shape cut under a CCD channel 16. The first wells 15 of FIG. 6c are separated from each other in the horizontal direction as well as in the vertical direction to define islands.

Figure 7:
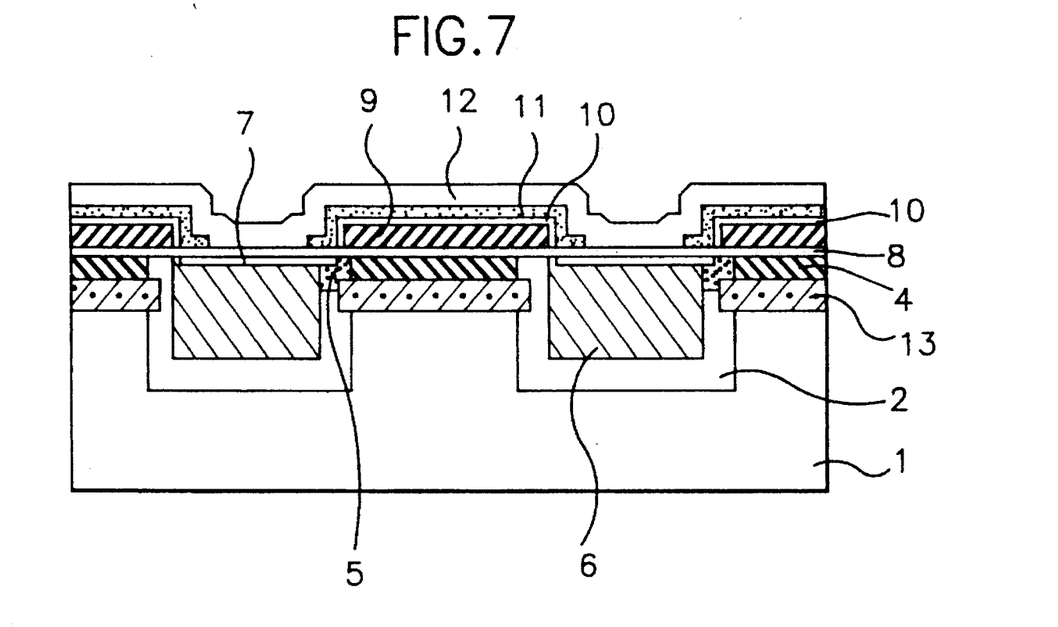
FIG. 7 is a view corresponding to FIG. 1, but showing a sixth embodiment of the present invention.

Turning to FIG. 7, there is shown in a horizontal sectional view a pixel according to a sixth embodiment of the present invention which is adapted to the structure of the primary embodiment of FIG. 1.

In the present invention, it is preferred to form a P$^+$ region as the region under the CCD channel region 4 to completely separate the CCD channel region 4 from the N-type silicon substrate 1 biased by the positive potential and to reliably restrict the potential variation caused by the electric charge generated by the intensive incident light.

However, when all of the wells are formed as having higher concentration, a problem is generated in the electric charge transmission from the photo diode 6 to the CCD.

In this regard, it is preferred to form a P$^+$ buried layer 13 of a higher concentration only in the region under the CCD channel 4 as shown in FIG. 7.

This P$^+$ buried layer 13 of the higher concentration renders the CCD channel 4 reliably separated from the silicon substrate 1 and improves the resistance against the smear as well as against the blooming.

Of course, the P$^+$ buried layer 13 of the higher concentration may be adapted to any one of the aforementioned first to fifth embodiments of the present invention and yields the same effect as described for the sixth embodiment of FIG. 7.

In the above description, The terms "the horizontal direction" and "the vertical direction" denote directions when the image is displayed on a television receiver screen. In practical, this vertical direction is equal to the signal charge transmission direction in the pixel region on the CCD and the horizontal direction is perpendicular to the above vertical direction.

Of course, the well structure of the present invention may be adapted to an one-dimensional solid state image sensor instead of the aforementioned two-dimensional solid state image sensor and yields the same result as that described above without affecting the functioning of this invention.

As described above, the present invention provides a well structure suitable for used in a solid state image sensor which reliably restricts the smear as well as the blooming.

What is claimed is:

1. A solid state image sensor, comprising:

a semiconductor substrate;

a plurality of photodiodes for photoelectric conversion; and a plurality of charge coupled devices (CCDs) for signal charge transmission and disposed in CCD channel regions;

and having a vertical overflow drain structure;

wherein the improvement comprises:

a plurality of first wells;

each said first well having an island shape, enclosing a corresponding said photodiode, and being spaced from one another in all directions;

said first wells being disposed in a well layer; and a plurality of second wells covering said CCD channel regions and having a depth less than that of said first well layer;

each of said second wells having a conductivity opposed to that of said substrate, and serving as a separating zone for separating said CCD channel regions from said substrate on at least a pixel region; and a plurality of buried layers which are formed under said second wells and separated from said second wells.

2. A solid state image sensor, comprising: a semiconductor substrate; a plurality of photodiodes for photoelectric conversion; and a plurality of charge coupled devices (CCDs) for signal charge transmission and disposed in CCD channel regions; and having a vertical overflow drain structure; wherein the improvement comprises:

a plurality of island wells, each said island well having an island construction enclosing a corresponding said photodiode, said island wells being disposed in a well layer;

a plurality of second wells covering said CCD channel regions and having a depth less than that of said well layer, each of said second wells having a conductivity opposed to that of said substrate, and serving as a separating zone for separating said CCD channel regions from said substrate on at least a pixel region;

wherein all adjacent said photodiodes located in respective said island wells are vertically and horizontally isolated from one another; and a plurality of buried layers which are formed under said second wells and separated from said second wells.

3. The solid state image sensor of claim 2 wherein said wells have a conductivity opposed to that of said substrate.

4. The solid state image sensor of claim 2 wherein said wells have an opposite dopant type than said substrate.

5. The solid state image sensor of claim 2 wherein said well layer is formed on said substrate.

6. A solid state image sensor, comprising:

a semiconductor substrate of a first conductivity type;

a plurality of first well layers of a second conductivity type formed in the substrate;

a plurality of second well layers of the second conductivity type formed in the substrate which are shallower than the first well layers;

a plurality of buried layers of the first conductivity type formed in the substrate so as to be located under the second well layers and separated from the first and second well layers.

7. The solid state image sensor of claim 6, further comprising:

a plurality of fourth well layers of the first conductivity type in the first well layers, wherein the fourth well layers are isolated from each other by the first well layers.

8. The solid state image sensor of claim 7, wherein the fourth well layers comprise photodiodes.

9. The solid state image sensor of claim 7, further comprising:

a plurality of channel regions which are covered by the second well layers.

10. The solid state image sensor of claim 6, wherein the first conductivity type is an N-type and the second conductivity type is a P-type.

11. The solid state image sensor of claim 6, wherein the buried layers have a higher concentration of ions than the substrate.

* * * * *

UNITED STATES PATENT AND TRADEMARK OFFICE
CERTIFICATE OF CORRECTION

PATENT NO. : 5,578,842
DATED : Nov. 26, 1996
INVENTOR(S) : Uya SHINJI

It is certified that error appears in the above-indentified patent and that said Letters Patent is hereby corrected as shown below:

Item [75] INVENTOR: "Uva Shinji" should read --Uya Shinji--.

Column 8, line 22, "layers;" should be --layers; and --.

Signed and Sealed this

Thirtieth Day of December, 1997

*Attest:*

BRUCE LEHMAN

*Attesting Officer*   Commissioner of Patents and Trademarks